United States Patent [19]
Dreifus et al.

[11] Patent Number: 5,872,415
[45] Date of Patent: Feb. 16, 1999

[54] MICROELECTRONIC STRUCTURES INCLUDING SEMICONDUCTOR ISLANDS

[75] Inventors: David L. Dreifus; Dean M. Malta, both of Cary, N.C.

[73] Assignee: Kobe Steel USA Inc., Research Triangle Park, N.C.

[21] Appl. No.: 698,869

[22] Filed: Aug. 16, 1996

[51] Int. Cl.$^6$ .................................. H01L 41/08
[52] U.S. Cl. ........................................ 310/311
[58] Field of Search ...................... 310/311, 313 A, 310/313 B, 328, 313 R

[56] References Cited

U.S. PATENT DOCUMENTS

| | | | |
|---|---|---|---|
| 3,761,783 | 9/1973 | Kroger et al. | 317/234 R |
| 3,816,194 | 6/1974 | Kroger et al. | 156/3 |
| 3,849,217 | 11/1974 | Kroger et al. | 156/11 |

(List continued on next page.)

FOREIGN PATENT DOCUMENTS

| | | | |
|---|---|---|---|
| 63-307778 | 12/1988 | Japan | 310/311 |
| 1-222489 | 9/1989 | Japan | 310/311 |
| 1-261878 | 10/1989 | Japan | 310/311 |
| 3-16412 | 1/1991 | Japan | 310/313 R |
| 3-262175 | 11/1991 | Japan | 310/311 |
| 5-90862 | 4/1993 | Japan | 310/313 A |
| 6-21755 | 1/1994 | Japan | 310/313 R |
| 3,896,473 | 7/1975 | DiLorenzo et al. | 357/15 |
| 3,925,078 | 12/1975 | Kroger et al. | 96/36.2 |

OTHER PUBLICATIONS

Q.-Y. Tong et al., Silicon Carbide Wafer Bonding, J. Electrochem. Soc., vol. 142, No. 1, Jan. 1995, pp. 232–236.

S. Katsumata, Patterning Of CVD Diamond Films By Seeding And Their Field Emission Properties, International Journal On The Science And Technology Of Diamond And Related Materials, Diamond and Related Materials, vol. 3, No. 11–12, Nov. 1994, pp. 1296–1300.

Michael W. Geis, Diamond Transistor Performance And Fabrication, Proceedings of the IEEE, vol. 79, No. 5, May 1991, pp. 669–676.

G. S. Gildenblat, High–Temperature Thin–Film Diamond Field–Effect Transistor Fabricated Using A Selective Growth Method, IEEE Electron Device Letters, vol. 12, No. 2, Feb. 1991, pp. 37–39.

T. Inoue et al., Selected–Area Deposition Of Diamond Films, J.Appl.Phys., vol. 67, No. 12, Jun. 15, 1990, pp. 7329–7336.

J.L. Davidson et al., Selective Deposition Of Diamond Films, Journal of Electronic Materials, vol. 18, No. 6, 1989, pp. 711–715.

K. Hirabayashi et al., Selective Deposition Of Diamond Crystals By Chemical Vapor Deposition Using A Tungsten–Filament Method, Appl.Phys.Lett., vol. 53, No. 19, Nov. 7, 1988, pp. 1815–1817.

R. Ramesham et al., Selective Growth Of Polycrystalline Diamond Thin Films On A Variety Of Substrates Using Selective Damaging By Ultrasonic Agitation, J.Mater.Res., vol. 7, No. 5, May 1992, pp. 1144–1151.

G. Popovici et al., Nucleation And Selective Deposition Of Diamond Thin Films, Phys.Stat.Sol. (a), vol. 132, No. 233, 1992, pp. 233–252.

*Primary Examiner*—Thomas M. Dougherty
*Attorney, Agent, or Firm*—Myers Bigel Sibley & Sajovec

[57] ABSTRACT

A microelectronic structure includes a substrate, a semiconductor island on the substrate, and a filler material on the substrate and surrounding the semiconductor island. The semiconductor island includes a first semiconductor material and has a planar island surface opposite the substrate. The filler material includes a layer of a second semiconductor material having a planar single crystal surface adjacent the planar island surface opposite the substrate so that the planar island surface and the planar single crystal surface together define a smooth planar surface. The first semiconductor material can be diamond, and the second semiconductor material can be silicon. In addition, a microelectronic circuit can be provided on the filler material.

34 Claims, 10 Drawing Sheets

U.S. PATENT DOCUMENTS

| | | | |
|---|---|---|---|
| 4,643,161 | 2/1987 | Kim | 125/30 R |
| 4,952,832 | 8/1990 | Imai et al. | 310/313 A |
| 4,966,862 | 10/1990 | Edmond | 437/100 |
| 5,006,914 | 4/1991 | Beetz, Jr. | 357/61 |
| 5,010,033 | 4/1991 | Tokunaga et al. | 437/83 |
| 5,013,670 | 5/1991 | Arikawa et al. | 437/2 |
| 5,066,938 | 11/1991 | Kobashi et al. | 338/22 SD |
| 5,131,963 | 7/1992 | Ravi | 148/33.3 |
| 5,223,115 | 6/1993 | DiSanto et al. | 204/299 R |
| 5,272,104 | 12/1993 | Schrantz et al. | 437/63 |
| 5,278,092 | 1/1994 | Sato | 437/90 |
| 5,300,188 | 4/1994 | Tessmer et al. | 156/636 |
| 5,329,208 | 7/1994 | Imai et al. | 310/313 R |
| 5,355,568 | 10/1994 | Imai et al. | 29/25.35 |
| 5,391,895 | 2/1995 | Dreifus | 257/77 |
| 5,420,443 | 5/1995 | Dreifus et al. | 257/77 |
| 5,422,302 | 6/1995 | Yonehara et al. | 437/83 |
| 5,440,188 | 8/1995 | Krempl et al. | 310/313 A |
| 5,471,944 | 12/1995 | Sato | 117/84 |
| 5,514,628 | 5/1996 | Enomoto et al. | 437/247 |
| 5,672,240 | 9/1997 | Stoner et al. | 156/631.1 |
| 5,686,760 | 11/1997 | Miyakawa | 257/751 |

MICROELECTRONIC STRUCTURES INCLUDING SEMICONDUCTOR ISLANDS

SUMMARY OF THE INVENTION

The present invention relates to the field of semiconductor structures and more particularly to structures including semiconductor islands.

BACKGROUND OF THE INVENTION

Diamond is a preferred material for microelectronic devices because it has semiconductor properties that are superior to conventional semiconductor materials, such as silicon, germanium or gallium arsenide. Diamond provides a higher energy bandgap, a higher breakdown voltage, and a higher saturation velocity than these traditional semiconductor materials.

These properties of diamond yield a substantial increase in projected cutoff frequency and maximum operating voltage compared to devices fabricated using more conventional semiconductor materials. For example, silicon is typically not used at temperatures higher than about 200° C. and gallium arsenide is not typically used above 300° C. These temperature limitations are caused, in part, because of the relatively low energy band gaps for silicon (1.12 eV at ambient temperature) and gallium arsenide (1.42 eV at ambient temperature) Diamond, in contrast, has a relatively high band gap of 5.47 eV at ambient temperature, and is thermally stable up to about 1400° C. in a vacuum.

Diamond also has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, that is, diamond is a "radiation-hard" material. Diamond is also relatively chemically inert, optically transparent, and mechanically hard. Accordingly, diamond can be used advantageously in optical applications, and its mechanical hardness means that it is robust and can be used as an extremely effective abrasive agent. These mechanical properties also produce excellent acoustic characteristics.

Because of the advantages of diamond as a material for microelectronic devices, there is at present an interest in the growth and use of diamond for devices which can be used in environments which are subjected to high temperatures, radiation, and/or corrosive agents. For example, there is an interest in the use of diamond for sensors, thermal management devices, and electron beam devices such as field emitters and electron-activated switches. There is also an interest in the use of diamond for Surface Acoustic Wave ("SAW") devices because of the relatively high velocity of surface acoustic waves through diamond. SAW devices including diamond layers are discussed in U.S. Pat. No. 5,329,208, U.S. Pat. No. 5,355,568, and U.S. Pat. No. 4,952,832, all to Imai et al.

Unfortunately, the fabrication of a single crystal diamond film is typically carried out by homoepitaxial deposition of a diamond film on a single crystal diamond substrate. Such a single crystal diamond substrate is relatively expensive. In addition, large single crystal substrates may not be available for many applications.

A continuous layer of diamond, however, may not be suited for the large scale production of diamond devices or structures because a wafer with a continuous diamond layer may be difficult to cut into individual die. The ability to efficiently cut the production wafer into individual die is important because economies of scale dictate that many devices be fabricated simultaneously on a single wafer and then cut apart after fabrication. While substrates made from conventional materials such as silicon can be cut using a mechanical saw, a substrate including a diamond layer may require a more complicated cutting tool such as a laser because of the extreme hardness of diamond. Lasers, however, may be relatively expensive, and may induce micro cracks or other damage in the diamond. The use of lasers may also cause adhesion problems as a result of localized heating and thermal expansion, formation of non-diamond phases along the edges of cuts, and ablation of carbon residue onto devices.

A proposed microelectronic device having one or more semiconductor devices formed on a single crystal substrate, such as diamond, is described in U.S. Pat. No. 5,006,914 entitled "Single Crystal Diamond Substrate Articles and Semiconducting Device Comprising Same" to Beetz, Jr. et al. This patent discloses a microelectronic structure including a single crystal diamond substrate which is etched to form an array of spaced apart posts of single crystal diamond. On each post is grown a semiconducting layer of single crystal diamond to serve as an active channel region of a respective semiconductor device. Unfortunately, the use of a large single crystal diamond substrate as the starting point for the fabrication of the Beetz structure is relatively expensive. In addition, the diamond substrate may be difficult to cut into individual die.

Another microelectronic structure is described in U.S. Pat. No. 5,420,443 entitled "Microelectronic Structure Having An Array Of Diamond Structures On A Nondiamond Substrate And Associated Fabrication Methods" to Dreifus et al. The '443 patent is assigned to the assignee of the present invention, and it represents a significant advance in the state of the art. The '443 patent and the present invention also share common inventors.

The microelectronic structure of the '443 patent includes a single crystal non-diamond substrate, and a plurality of laterally spaced apart diamond structures are formed on the substrate extending outwardly therefrom. An interfacial carbide layer is preferably formed between the plurality of diamond structures and the non-diamond substrate, and the diamond structures are substantially oriented with respect to the non-diamond substrate. The diamond structures preferably have a substantially flat outermost face having a (100)-orientation to thereby provide a relatively large usable area in contrast to other crystalline orientations. The embodiment of the method of this patent provides nucleation of an array of diamond structures, each approaching single crystal quality without scratching or abrading the surface of the substrate.

Still another microelectronic structure is described in U.S. Pat. No. 5,300,188 entitled "Process For Making Substantially Smooth Diamond" to Tessmer et al. The '188 patent is also assigned to the assignee of the present invention, and it also represents a significant advance in the state of the art. The '188 patent and the present invention also share common inventors.

The '188 patent discusses a process for making a diamond layer having a substantially smooth upper surface and a predetermined thickness on a substrate. The process includes depositing a patterned polish stopping layer on a substrate to a predetermined thickness while leaving predetermined portions of the substrate exposed. In particular, the polish stopping layer is preferably a layer of a material such as various metals, polysilicon, silicon nitride, silicon oxide or other suitable materials capable of substantially stopping the consumption of diamond. A diamond layer is then deposited on the polish stopping layer and on the predetermined portions of the substrate left exposed.

Notwithstanding the above mentioned references, there continues to exist a need in the art for improved diamond structures which can be used in the fabrication of microelectronic devices. There also exists a need in the art for diamond structures which can be produced economically and subsequently processed using conventional microfabrication techniques.

SUMMARY OF THE INVENTION

In view of the foregoing background, it is therefore an object of the present invention to provide improved structures for forming microelectronic devices.

It is another object of the present invention to provide improved diamond based structures for microelectronic devices.

These and other objects, features, and advantages of the present invention are provided by a microelectronic structure including a semiconductor island on a substrate, and a filler material on the substrate and surrounding the semiconductor island. The semiconductor island comprises a first semiconductor material and has a planar surface opposite the substrate. The filler material comprises a layer of a second semiconductor material having a planar single crystal surface adjacent the planar island surface so that the planar island surface and the planar single crystal surface together define a smooth planar surface. In particular, the first semiconductor material can be diamond, and the second semiconductor material can be silicon.

This structure allows the semiconductor islands to be diced apart without cutting through the first semiconductor material. Accordingly, the semiconductor islands can be formed from diamond and then diced apart using conventional techniques because the diamond is not cut. The smooth planar surface of this structure allows subsequent processing with conventional microfabrication techniques. In addition, the single crystal filler material allows the formation of electronic circuits thereon. For example, resistors, capacitors, transistors, and diodes can be formed on the single crystal filler material adjacent the diamond islands thus providing electronic processing capabilities.

In one embodiment, the substrate is a single crystal material, and the filler material of the second semiconductor material extends as a single crystal from the substrate to the planar single crystal surface. More particularly, the substrate and the filler material can both be formed from the second semiconductor material. Accordingly, the filler material can be formed by epitaxial deposition, or by etching depressions in the substrate and forming the semiconductor islands in the depressions.

Alternately, the substrate can be a third material different from the first and second semiconductor materials such as titanium, molybdenum, nickel, tungsten, copper, tantalum, silicon carbide, tungsten carbide, silicon nitride, silicon aluminum oxynitride, boron nitride, silicon dioxide, or aluminum oxide. Besides diamond, the first semiconductor material can be silicon carbide, gallium nitride, aluminum nitride, boron nitride, or alloys of group III–V nitrides.

By using diamond for the first semiconductor of the semiconductor islands, a surface acoustic wave device having a high velocity of surface acoustic wave propagation can be produced. In particular, a layer of a piezoelectric material can be provided on the semiconductor island, and a pair of interdigitated electrodes can be formed on the piezoelectric layer.

According to another aspect of the present invention, a microelectronic structure includes a semiconductor island on a substrate, a filler material on the substrate and surrounding the island, and a microelectronic circuit on the filler material adjacent the semiconductor island. The semiconductor island comprises a first semiconductor material and has a planar island surface opposite the substrate. The filler material has a planar surface adjacent the planar island surface. Accordingly, the electronic processing capabilities can be provided on the structure.

In yet another aspect of the present invention, a piezoelectric structure includes a plurality of semiconductor islands on the substrate, a filler material on the substrate and surrounding each of the semiconductor islands, and a piezoelectric layer on at least one of the semiconductor islands. Each of the semiconductor islands comprises a first semiconductor material and has a planar island surface opposite the substrate wherein an interfacial surface of each of the semiconductor islands is adjacent the substrate and a growth surface of each of the islands is opposite the substrate. The filler material has a planar filler surface adjacent the planar island surfaces so that said planar filler surface and said planar semiconductor surfaces together define a smooth planar surface. Accordingly, a surface acoustic wave device having a relatively high velocity of surface acoustic wave propagation can be provided.

The microelectronic structure according to the present invention can include diamond islands surrounded by a single crystal filler material. Accordingly, individual diamond devices can be fabricated on the diamond islands using conventional microfabrication techniques and diced apart using conventional dicing techniques. In addition, electronic circuits can be formed on the filler material between the diamond islands thus providing electronic processing capabilities.

DETAILED DESCRIPTION

Figure 1:
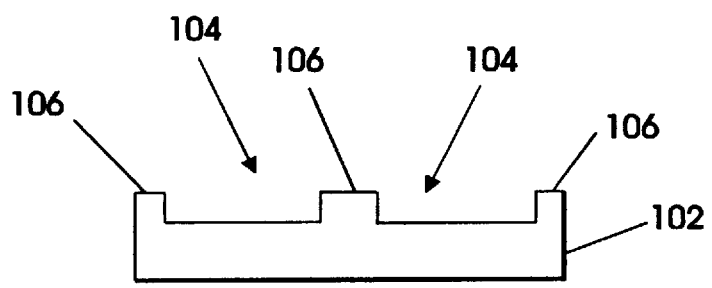
FIGS. 1–4 are cross-sectional views illustrating steps of a first method for fabricating a microelectronic structure according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

According to the present invention, a microelectronic structure includes a substrate, a semiconductor island on the substrate, and a filler material on the substrate and surrounding the semiconductor island. The semiconductor island includes a first semiconductor material, such as diamond, and has a planar surface opposite the substrate. The filler material may include a layer of a second semiconductor material, such as silicon, with a planar single crystal surface adjacent the planar surface of the island so that the island and the single crystal surface together define a smooth planar surface.

A first method for fabricating the microelectronic structure of the present invention is illustrated in FIGS. 1–4. In FIG. 1, a substrate 102 is etched or machined to form the depressions 104. The remaining raised portions 106 of the substrate separate the depressions 104. The depressions can be formed using standard microfabrication techniques such as those used in the fabrication of microelectromechanical structures (MEMS). The substrate 102 can be formed from a semiconductor material such as silicon, a metal, a ceramic, or other materials suitable for the formation of the semiconductor islands. In addition, the substrate can be formed from titanium, molybdenum, nickel, tungsten, copper, tantalum, silicon carbide, tungsten carbide, silicon nitride, silicon aluminum oxynitride, boron nitride, silicon dioxide or aluminum oxide.

In the structure of FIG. 1, raised portions 106 can be produced with heights on the order of 5 $\mu$m to 50 $\mu$m. The raised portions can be on the order of 20 $\mu$m to 1000 $\mu$m wide. In particular, the heights of the raised portions can be on the order of 30 $\mu$m and widths of the raised portions can be on the order of 250 $\mu$m. The 250 $\mu$m width provides sufficient space between diamond islands to dice a wafer using a conventional saw without cutting diamond. Alternately, the widths of the raised portions can be greater than 1000 $\mu$m to provide space to form circuits thereon.

Figure 2:
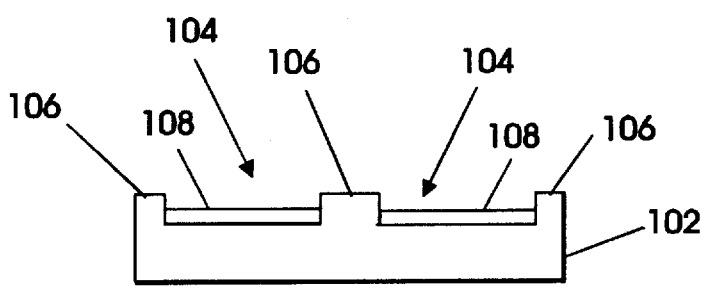
Figure 3:
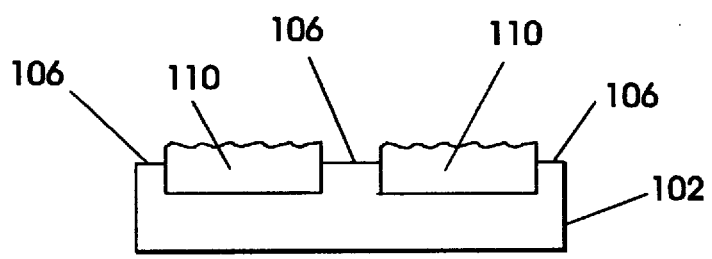

A layer 108 of a material including nucleation sites is selectively formed in the depressions as shown in FIG. 2. The layer 108 including nucleation sites is then used to promote the selective deposition of the semiconductor islands 110 as shown in FIG. 3. In particular, the layer 108 including nucleation sites can be a photosensitive material including diamond nucleation sites which can be photolithographically patterned. Accordingly, diamond can be selectively deposited on the patterned nucleation layer to form diamond islands. For the purposes of this disclosure, the first semiconductor material of the semiconductor islands is defined to include both doped and undoped diamond or other semiconductor materials which may be conducting, semiconducting or insulating. The semiconductor islands can alternately be formed from other semiconductor materials known to those having skill in the art. For example, the semiconductor islands 110 can be formed from gallium arsenide, silicon carbide, silicon, carbon nitride, gallium nitride, aluminum nitride, boron nitride or alloys of group III–V nitrides.

Figure 4:
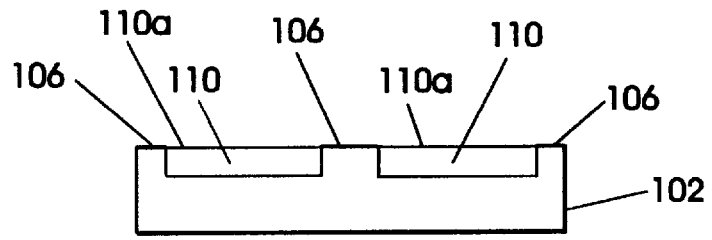

The semiconductor islands 110 can then be polished down to the level of the raised portions 106 of the substrate 102 as shown in FIG. 4. Accordingly, the surface 110a of the semiconductor islands 110 opposite the substrate 102 is planar. Furthermore, the planar island surface 110a and the planar surface of the raised portions 106 of the substrate 102 together define a smooth planar surface. In a particular embodiment, the substrate 102 is a single crystal silicon substrate, and the semiconductor islands 110 are diamond.

The raised portions 106 of the substrate can be defined as a filler material between the diamond islands. The diamond islands can be used in the formation of microelectronic structures such as surface acoustic wave devices, and the smooth single crystal silicon filler material therebetween can be used to form electronic structures such as resistors, capacitors, transistors, and diodes. Furthermore, because the diamond islands and silicon filler material together define a smooth planar surface, the structure of FIG. 4 can be used in standard microfabrication processes requiring overall planarity such as photolithography.

The structure of FIG. 4 also allows the fabrication of microelectronic devices on the diamond islands without requiring the diamond to be cut when dicing the substrate. That is, individual devices can be formed on the diamond islands and then diced apart by cutting through the substrate at portions thereof where the raised portions 106 of the substrate are not covered by diamond. Accordingly, the structure can be diced by conventional techniques. Stress is also reduced in the structure because diamond does not coat the entire surface of the substrate. The stress is reduced because less of the substrate is covered with diamond thereby reducing interfacial stresses.

Figure 5:
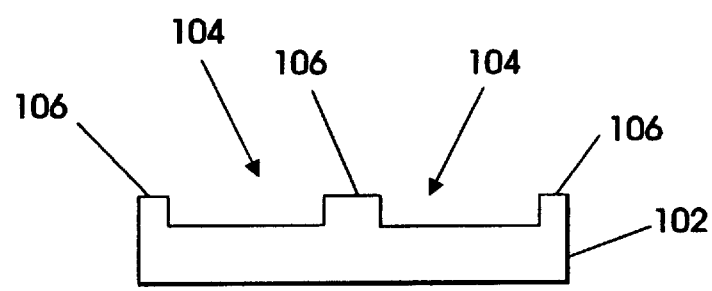
FIGS. 5–8 are cross-sectional views illustrating steps of a second method for fabricating a microelectronic structure according to the present invention.
Figure 6:
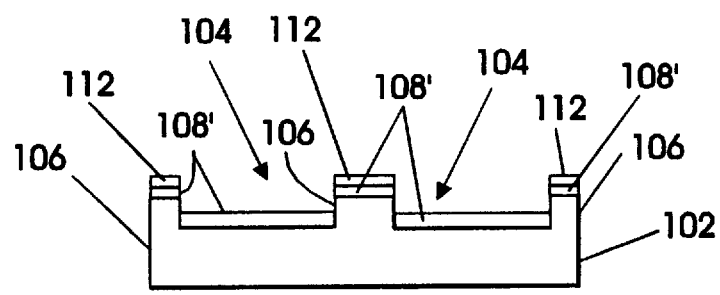

A second method of forming the structure of FIG. 4 is illustrated in FIGS. 5–8. As before, depressions 104 are formed in the substrate 102 leaving raised portions 106, as shown in FIG. 5. According to this method, however, a layer 108' including nucleation sites is formed across the entire substrate 102 including the raised portions 106. A patterned mask 112 is then formed on portions of the nucleation layer 108' opposite the raised portions 106 of the substrate 102.

Figure 7:
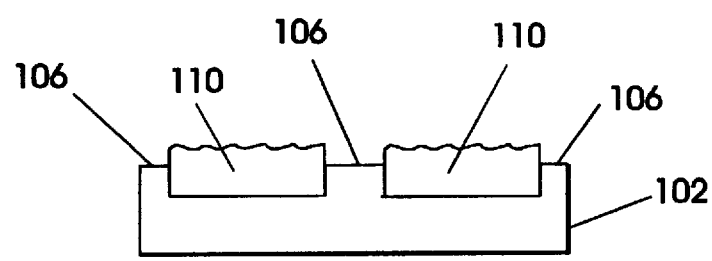
Figure 8:
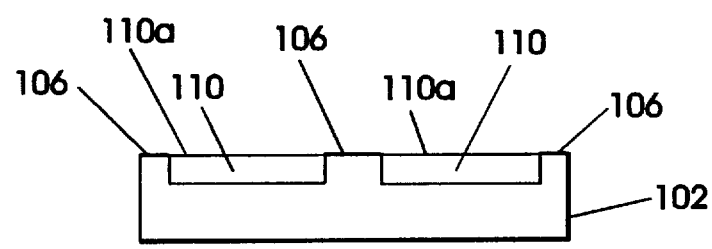

The mask layer inhibits diamond nucleation thus promoting the selective deposition of the diamond islands 110 in the depressions 104 as shown in FIG. 7. The mask layer 112 can be formed from any material which inhibits diamond nucleation such as silicon dioxide. Once the diamond islands 110 have been formed, the portions of the nucleation layer 108' on the raised portions 106 of the substrate 102 and the patterned mask layer 112 are removed. As discussed above, the diamond islands 110 are polished so that a smooth planar surface is formed across the diamond islands and raised portions of the substrate as shown in FIG. 8.

Figure 9:
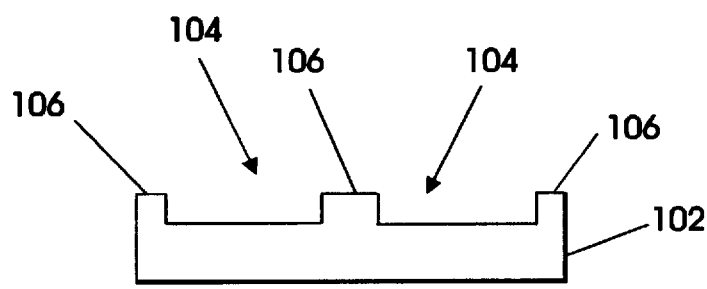
FIGS. 9–12 are cross-sectional views illustrating steps of a third method for fabricating a microelectronic structure according to the present invention.
Figure 10:
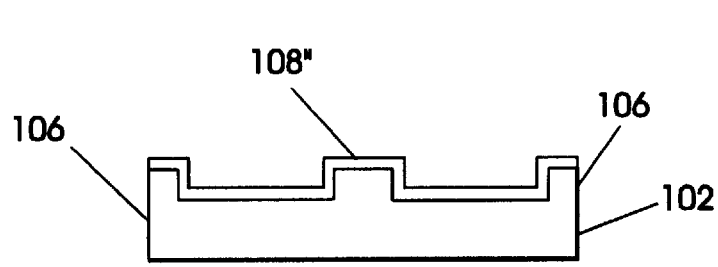
Figure 11:
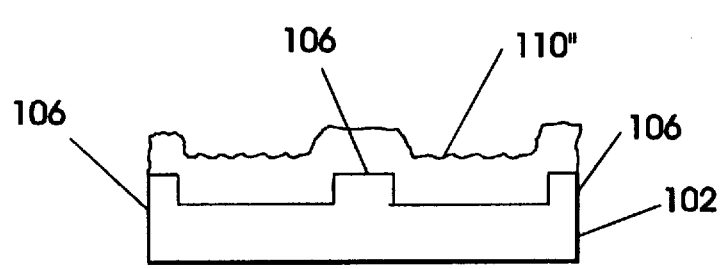
Figure 12:
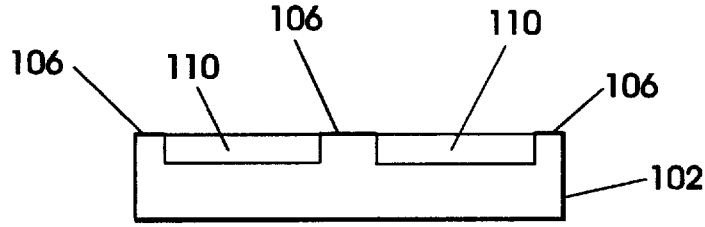

A third method of forming the structure of FIG. 4 is illustrated in FIGS. 9–12. As before, depressions 104 are formed in the substrate 102 leaving raised portions 106, as shown in FIG. 9. According to this method, a nucleation layer 108" including nucleation sites is formed across the entire substrate 102 including the raised portions 106, as shown in FIG. 10. A continuous diamond layer 110" is formed on the substrate as shown in FIG. 11. The diamond layer 110" can then be polished down to the raised portions of the substrate as shown in FIG. 12.

Figure 13:
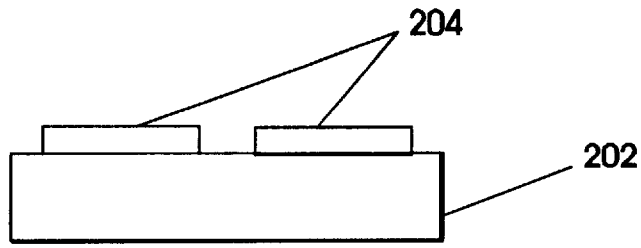
FIGS. 13–17 are cross-sectional views illustrating steps of a fourth method for fabricating a microelectronic structure according to the present invention.
Figure 14:
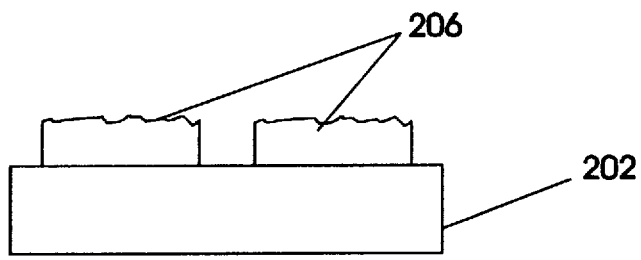

A method for forming an alternate structure according to the present invention is illustrated in FIGS. 13–17. According to this method, a patterned layer 204 of nucleation sites is formed on substrate 202, as shown in FIG. 13. This patterned layer of nucleation sites facilitates the selective deposition of diamond islands 206 on the substrate 202 as shown in FIG. 14.

Figure 15:
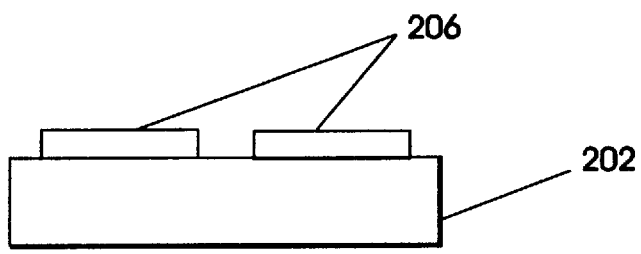
Figure 16:
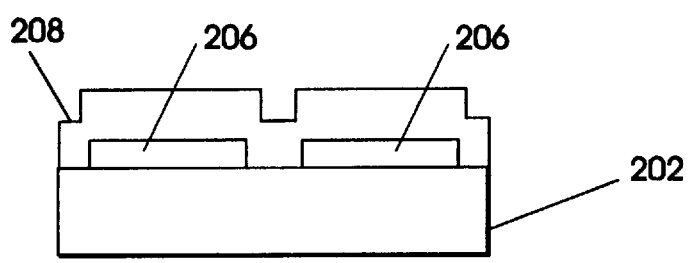

The diamond islands 206 can then be polished as shown in FIG. 15 to have smooth planar surfaces opposite the substrate. A layer of a filler material 208 can be formed on the diamond islands 206 and exposed portions of the substrate 202 as shown in FIG. 16. The filler material 208 can then be polished down to the level of the diamond islands 206 to form the structure of FIG. 17.

Diamond islands can be produced with heights on the order of 5 μm to 50 μm and with spaces therebetween on the order of 20 μm to 1000 μm wide. These widths provide sufficient space between diamond islands to dice a wafer using a conventional saw without cutting diamond. In particular, diamond islands can be produced with heights on the order of 22 μm and with spaces therebetween on the order of 250 μm. Alternately, the spaces between diamond islands can be greater than 1000 μm to provide space to form circuits on the filler material.

Figure 17:
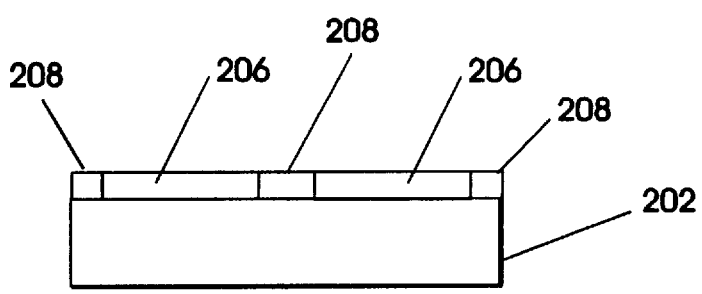
Figure 18:
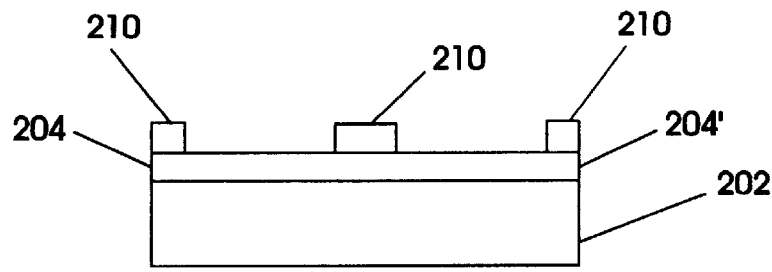
FIGS. 18–22 are cross-sectional views illustrating steps of a fifth method for fabricating a microelectronic structure according to the present invention.
Figure 31:
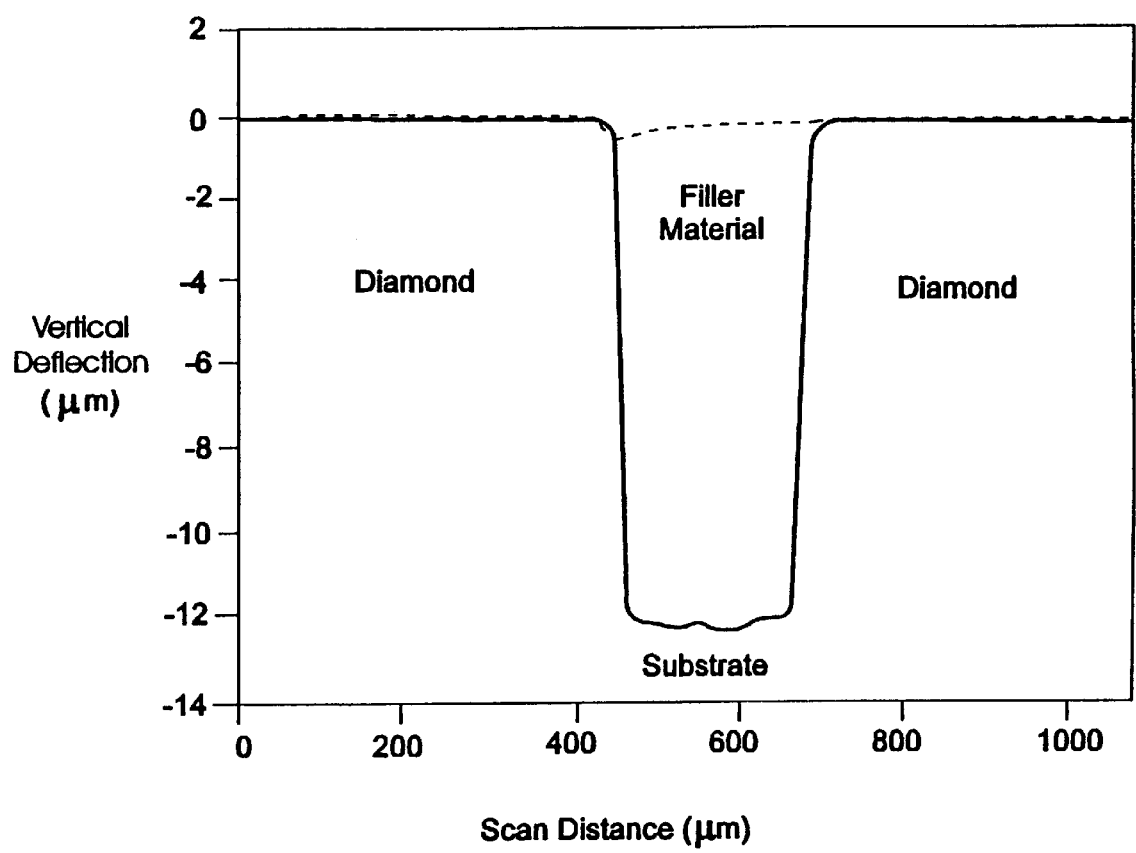
FIG. 31 is a profilometry scan of the surface of the microelectronic structure of FIG. 17.

The structure of FIG. 17 can be produced with diamond islands 206 and filler material 208 having heights on the order of 12 μm. The filler material 208 between diamond islands can be produced with a width on the order of 250 μm. A profilometry scan of a structure according to FIG. 17 is illustrated in FIG. 31. The solid line illustrates the profile of the diamond islands before forming the filler material, and the dotted line illustrates the profile of the diamond islands together with the filler material. As previously discussed, a filler material with a width on the order of 250 μm provides sufficient space between diamond islands to dice a wafer using a conventional saw without cutting diamond.

Any substrate material suitable for the selective deposition of diamond can be used in the method of FIGS. 13–17. For example, the substrate 202 can be a semiconductor material such as silicon, a metal, or a ceramic. The filler material 208 can be formed from the same material as the substrate 202. Alternately, the filler material can be formed from a ceramic material, a semiconductor material, a metal, or a polymer. Some preferred materials for the filler material include silicon, silicon dioxide, silicon nitride, silicon oxynitride, glass, polyimide, and benzocyclobutene.

In a preferred embodiment, the substrate 202 is a single crystal layer of a semiconductor material such as silicon, and the filler material 208 is the same as the substrate material. The filler material 208 can thus be epitaxially deposited on the exposed portions of the substrate 202 so that it also has a single crystal structure. Alternately, the filler material can be deposited as a polycrystalline or amorphous film and then recrystallized to form a single crystal layer adjacent the islands 206. By providing a single crystal silicon filler material between the islands, electronic circuits can be formed thereon adjacent the islands. The electronic circuits can be used to provide an electronic processing capability for the device so formed.

Figure 19:
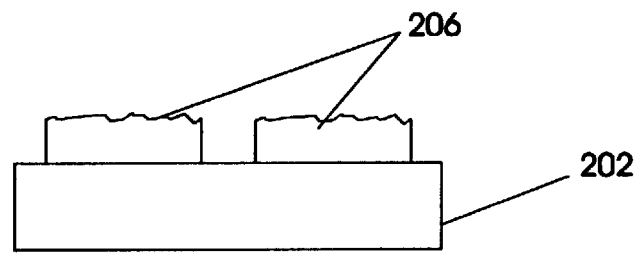
Figure 20:
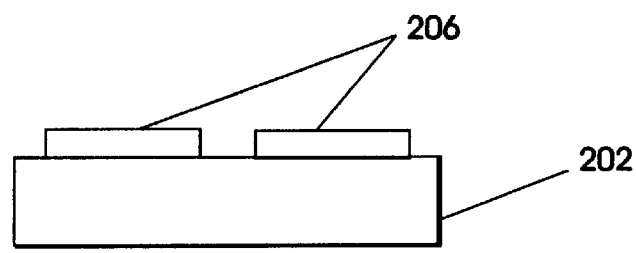

A second method for fabricating the structure of FIG. 17 is illustrated in FIGS. 18–22. In this method, a continuous layer 204' including nucleation sites is formed on the substrate 202, and a patterned mask layer 210 is formed thereon. The patterned mask layer 210 inhibits diamond nucleation, so that diamond islands 206 are selectively formed on the substrate 202. After forming the diamond islands 206, the patterned mask layer 210 and the remaining portions of the nucleation layer 204' are removed, as shown in FIG. 19. The diamond islands 206 are then polished to have smooth planar surfaces opposite the substrate as shown in FIG. 20.

Figure 21:
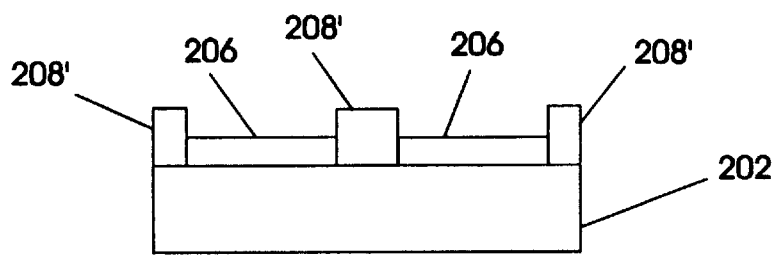
Figure 22:
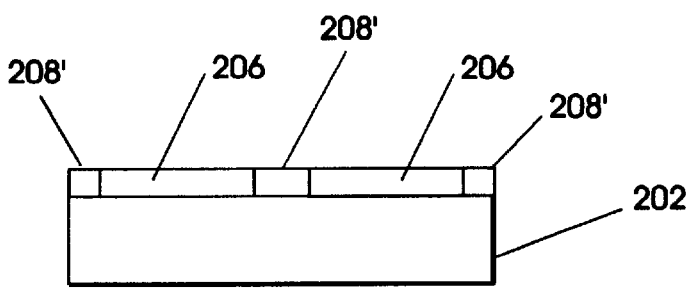

In FIG. 21, the filler material 208' is selectively deposited on exposed portions of the substrate, and in FIG. 22, the excess portions of the filler material 208' are polished so that the structure has a smooth planar surface across the diamond islands and filler material therebetween. While separate polishing steps are shown for the diamond islands 206 and the filler material 208 and 208', a single polishing step can be used to polish both down to a smooth planar surface.

Figure 23:
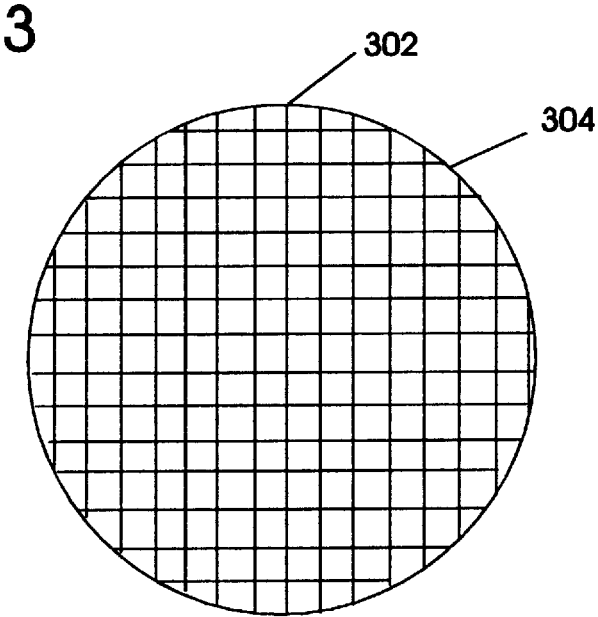
FIG. 23 is a plan view of a substrate including a plurality of microelectronic structures according to the present invention.

A top view of a microelectronic structure according to the present invention is illustrated in FIG. 23. As shown, a plurality of diamond islands 304 are formed on a single substrate, and separated by a filler material 302 therebetween. Because the islands and filler material have been polished as discussed above, the surface of this structure is smooth allowing subsequent processing by conventional microfabrication techniques. By forming the filler material from a single crystal material such as silicon, electronic circuits can be formed thereon as discussed below.

Figure 24:
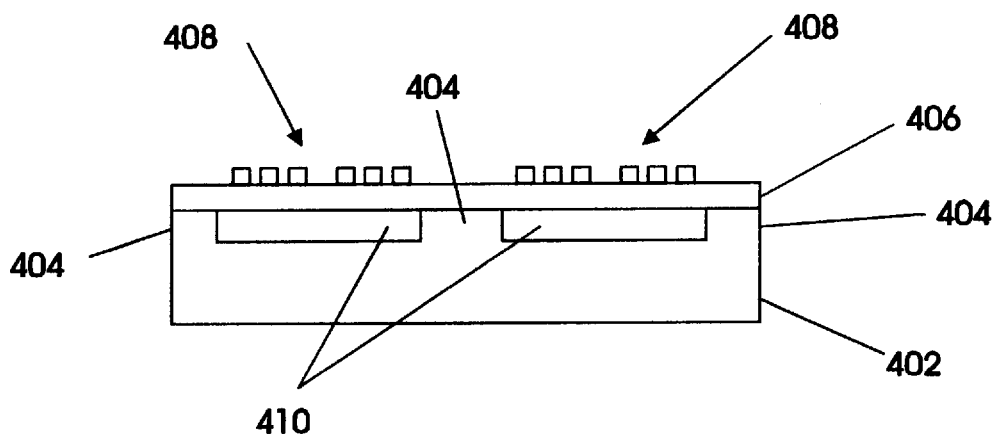
FIGS. 24 and 25 are cross-sectional views of surface acoustic wave devices formed on semiconductor islands according to the present invention.
Figure 25:
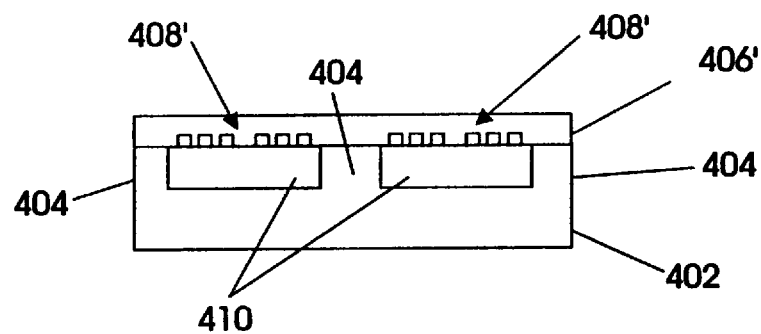

The diamond islands can be advantageously used to form surface acoustic wave (SAW) devices, as shown in FIG. 24. In particular, diamond islands 410 are selectively formed on the substrate 402 and separated by the filler material 404. A piezoelectric layer 406 can then be formed on the diamond islands 410, and interdigitated electrodes 408 can be formed on the piezoelectric layer 406. Alternately, the interdigitated electrodes 408' can be formed on the diamond islands 410 and the piezoelectric layer 406' formed thereon, as shown in FIG. 25. According to still another alternative, the islands can be formed from a piezoelectric semiconductor material, and the interdigitated electrodes can be formed directly on the piezoelectric semiconductor material.

The diamond layer provides a high velocity of surface acoustic wave propagation as well as the capacity for high temperature operation. Additional surface acoustic wave structures can also be provided according to the present invention. Additional surface acoustic wave structures are discussed, for example, in U.S. Pat. No. 5,355,568 entitled "Method of Making a Surface Acoustic Wave Device" to Imai et al.; U.S. Pat. No. 5,329,208 entitled "Surface Acoustic Wave Device and Method for Producing the Same" to Imai et al.; U.S. Pat. No. 4,952,832 entitled "Surface Acoustic Wave Device" to Imai et al.; U.S. Pat. No. 5,221,870 entitled "Surface Acoustic Wave Device" to Nakahata et al.; U.S. Pat. No. 5,294,858 entitled "Surface Acoustic Wave Device" to Nakahata et al.; and U.S. patent application Ser. No. 08/514,656 entitled "Smooth Diamond-Based Mesa Structures And Related Methods" to Dreifus et al. The disclosures of each of the above mentioned references is hereby incorporated herein in its entirety by reference.

Figure 26:
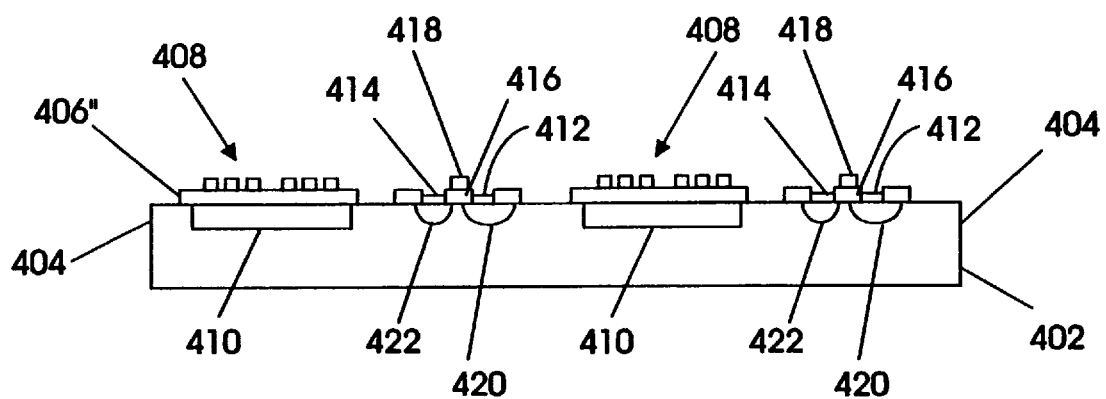
FIG. 26 is a cross-sectional view of a surface acoustic wave device and a transistor formed on a microelectronic structure according to the present invention.

The microelectronic structure of the present invention can also be used to provide electronic circuits on the filler material 404 adjacent each diamond island 410. In particular, when the filler material 404 is a single crystal layer of a semiconductor material such as silicon, conventional electronic circuits can be formed thereon. For example, by selectively removing the piezoelectric layer 406" from the filler material 404 a field effect transistor can be formed as shown in FIG. 26. This transistor includes a source region 420, a drain region 422, a source contact 412, a drain contact 414, an insulating gate layer 416, and a conductive gate layer 418.

Figure 27:
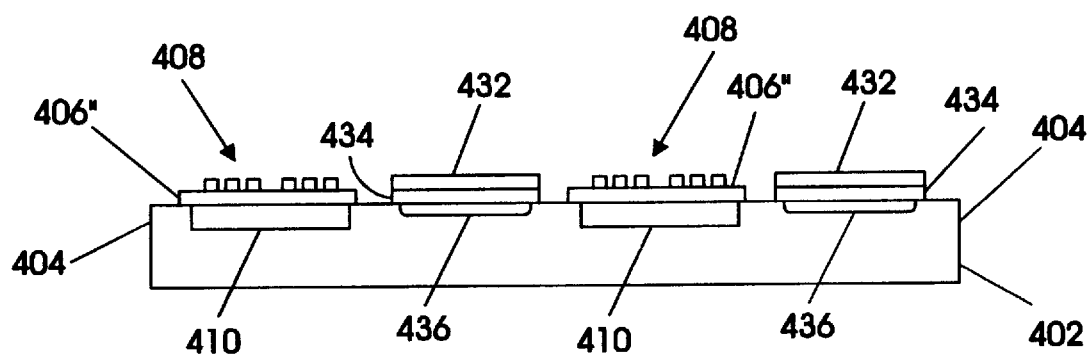
FIG. 27 is a cross-sectional view of a surface acoustic wave device and a capacitor formed on a microelectronic structure according to the present invention.
Figure 28:
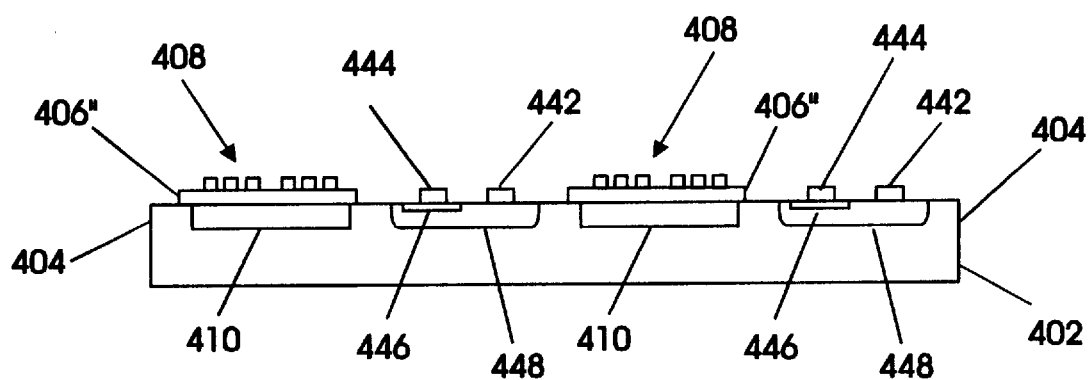
FIG. 28 is a cross-sectional view of a surface acoustic wave device and a diode formed on a microelectronic structure according to the present invention.
Figure 29:
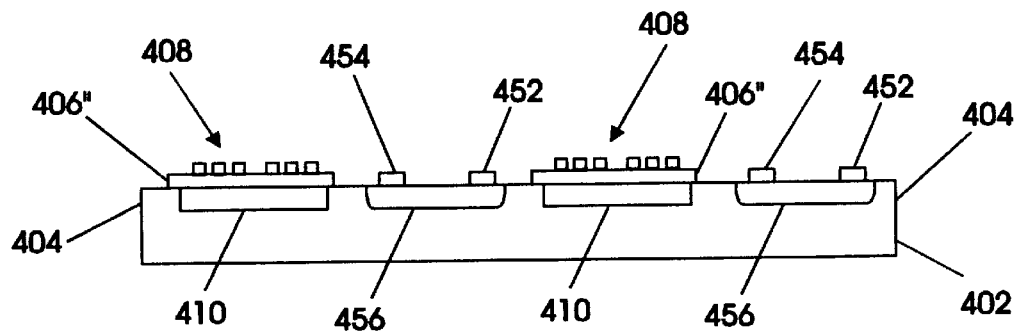
FIG. 29 is a cross-sectional view of a surface acoustic wave device and a resistor formed on a microelectronic structure according to the present invention.

Other circuits such as capacitors, diodes, and resistors can also be formed. In FIG. 27, a capacitor includes a doped region 436 of the filler material 404, a dielectric layer 434 such as silicon dioxide, and a conductive gate layer 432. In FIG. 28, a diode includes a first doped region 448 having a first conductivity type, a second doped region 446 having a second conductivity type, and first and second contacts 442 and 444. In FIG. 29, a resistor includes a doped region 456 of the filler material 404 and first and second contacts 452 and 454.

The electronic circuits discussed above, can be used to provide electronic processing capabilities for the SAW device. Tuned resistor-capacitor circuits can also be provided for the SAW device. In addition, inductors can be provided if desired for purposes such as impedance matching for SAW devices using LRC circuits. Inductors having structures known to those having skill in the art can be provided on the filler material. For example, a first plurality of parallel conductive lines can be formed on the filler material, and a dielectric or ferroelectric layer can be formed thereon. The inductor can be completed by forming vias through the dielectric or ferroelectric layer and forming a second plurality of conductive lines thereon so that opposite ends of adjacent lines from the first plurality of conductive lines are connected. Alternately, the opposite ends of adjacent parallel lines can be connected by wire bonding. According to yet another alternative, the inductance of a conductive line may be sufficient.

Figure 30:
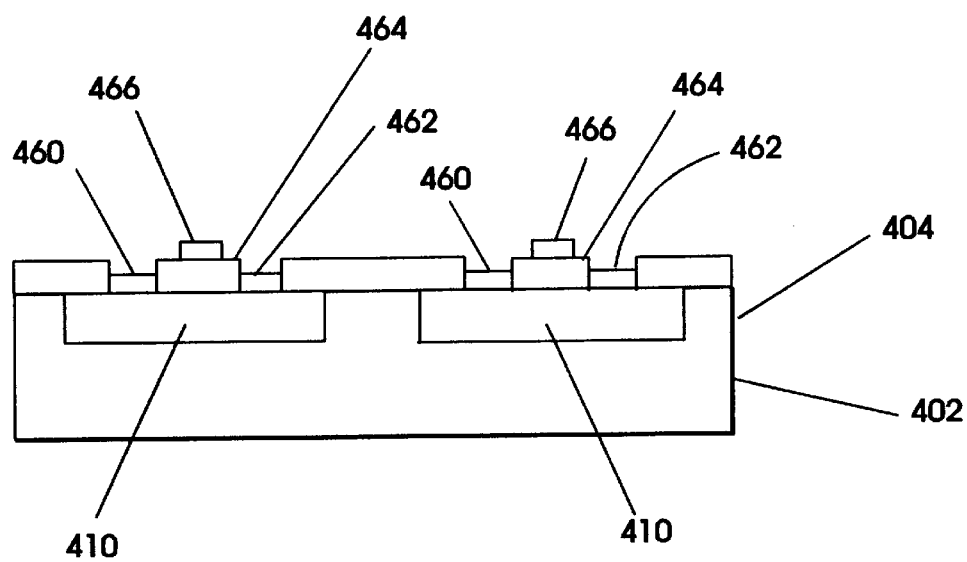
FIG. 30 is a cross-sectional view of transistors formed on semiconductor islands according to the present invention.

The diamond islands 410 of the present invention can also be used to form electronic circuits such as the transistor illustrated in FIG. 30. As shown, each transistor includes a source electrode 460, a drain electrode 462, an insulating gate layer 464, and a conductive gate electrode 466. The use of diamond islands in the formation of electronic circuits provides the advantages of radiation hardness, a high energy bandgap, high temperature operation, and chemical inertness.

As discussed above, microelectronic structures including diamond islands can be formed according to the present invention and used to produce electronic circuits, micromechanical devices, microacoustic devices and other microstructures known to those having skill in the art. The use of diamond islands allows the fabrication of a plurality of individual devices on a single substrate which can be separated by conventional dicing techniques. Furthermore, because the filler material and the surface of the diamond islands form a smooth planar surface, the structure can be subsequently processed using conventional microfabrication techniques. In addition, by providing a filler material which is a single crystal of a semiconductor material such as silicon, electronic circuits can be formed on the filler material adjacent the diamond islands.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A microelectronic structure comprising:
    a substrate;
    a semiconductor island on said substrate, said semiconductor island comprising a first semiconductor material and having a planar island surface opposite said substrate;
    a filler material on said substrate and surrounding said semiconductor island, said filler material comprising a layer of a second semiconductor material having a planar single crystal surface adjacent said planar island surface opposite said substrate so that said planar island surface and said planar single crystal surface together define a smooth planar surface;
    a microelectronic circuit on said filler material adjacent said semiconductor island; and
    a layer of a piezoelectric material on said semicondcutor island;
    wherein said first semiconductor material comprises diamond.

2. A microelectronic structure according to claim 1 wherein said layer of said second semiconductor material extends from said substrate to said planar single crystal surface.

3. A microelectronic structure according to claim 2 wherein said substrate comprises a single crystal layer of said second semiconductor material adjacent said filler material.

4. A microelectronic structure according to claim 1 wherein said substrate comprises a third material different from said first and second semiconductor materials.

5. A microelectronic structure according to claim 1 wherein said substrate comprises a third material chosen from the group consisting of titanium, molybdenum, nickel, tungsten, copper, tantalum, silicon carbide, tungsten carbide, silicon nitride, silicon aluminum oxynitride, boron nitride, silicon dioxide, and aluminum oxide.

6. A microelectronic structure according to claim 1 wherein said second semiconductor material comprises silicon.

7. A microelectronic structure according to claim 1 wherein said microelectronic circuit is chosen from the group consisting of a transistor, a capacitor, a diode, and a resistor.

8. A microelectronic structure according to claim 1 further comprising a pair of interdigitated electrodes on said piezoelectric material.

9. A microelectronic structure comprising:
    a substrate;
    a semiconductor island on said substrate, said semiconductor island comprising a first semiconductor material;
    a filler material on said substrate and surrounding said semiconductor island wherein said filler material is different from said first semiconductor material;
    a microelectronic circuit on said filler material adjacent said semiconductor island; and
    a piezoelectric layer on said semiconductor island;
    wherein said semiconductor island has a planar island surface opposite said substrate and wherein said filler material has a planar filler surface adjacent said planar island semiconductor surface opposite said substrate; and wherein said first planar semiconductor surface and said second planar surface together define a smooth planar surface.

10. A microelectronic structure according to claim 9 wherein said first semiconductor material comprises diamond.

11. A microelectronic structure according to claim 9 wherein said filler material comprises a layer of a second semiconductor material extending to said planar filler surface.

12. A microelectronic structure according to claim 11 wherein said layer of said second semiconductor material comprises a single crystal layer of said second semiconductor material.

13. A microelectronic structure according to claim 11 wherein said layer of said second semiconductor material extends from said substrate to said planar filler surface.

14. A microelectronic structure according to claim 13 wherein said substrate comprises a layer of said second semiconductor material adjacent said filler material.

15. A microelectronic structure according to claim 11 wherein said second semiconductor material comprises silicon.

16. A microelectronic structure according to claim 9 wherein said substrate comprises a material different from said filler material.

17. A microelectronic structure according to claim 9 wherein said first semiconductor material is chosen from the group consisting of silicon carbide, carbon nitride, gallium nitride, aluminum nitride, boron nitride, and alloys of group III–V nitrides.

18. A microelectronic structure according to claim 9 wherein said microelectronic circuit is chosen from the group consisting of a transistor, a capacitor, a diode, and a resistor.

19. A microelectronic structure according to claim 9 further comprising a pair of interdigitated electrodes on said piezoelectric layer.

20. A microelectronic structure according to claim 9 wherein said first semiconductor material is a piezoelectric semiconductor material.

21. A piezoelectric structure comprising:
a substrate;
a plurality of semiconductor islands on said substrate, each of said semiconductor islands comprising a first semiconductor material, wherein an interfacial surface of each of said semiconductor islands is adjacent said substrate and a growth surface of each of said islands is opposite said substrate;
a filler material on said substrate and surrounding each of said semiconductor islands wherein said filler material comprises a material different from said first semiconductor material;
a piezoelectric layer on at least one of said semiconductor islands wherein at least a portion of said filler material is not covered by said piezoelectric layer; and
a microelectronic circuit on said portion of said filler material not covered by said piezoelectric layer.

22. A piezoelectric structure according to claim 21 wherein each of said plurality of semiconductor islands has a planar island surface opposite said substrate, and wherein said filler material has a planar filler surface adjacent said planar island surfaces opposite said substrate so that said planar filler surface and said planar semiconductor surfaces together define a smooth planar surface.

23. A piezoelectric structure according to claim 21 further comprising at least one pair of interdigitated electrodes on said piezoelectric layer adjacent one of said semiconductor islands.

24. A piezoelectric structure according to claim 21 further comprising at least one pair of interdigitated electrodes on said piezoelectric layer opposite one of said semiconductor islands.

25. A piezoelectric structure according to claim 21 wherein said first semiconductor material comprises diamond and wherein said filler material comprises a layer of a second semiconductor material having a planar single crystal surface adjacent said planar island surface opposite said substrate so that said planar island surface and said planar single crystal surface together define a smooth planar surface.

26. A piezoelectric structure according to claim 21 wherein said filler material comprises a layer of a second semiconductor material.

27. A piezoelectric structure according to claim 26 wherein said layer of said second semiconductor material comprises a single crystal layer of said second semiconductor material.

28. A piezoelectric structure according to claim 26 wherein said layer of said second semiconductor material extends from said substrate to a surface of said filler material.

29. A piezoelectric structure according to claim 28 wherein said substrate comprises a layer of said second semiconductor material adjacent said filler material.

30. A piezoelectric structure according to claim 26 wherein said second semiconductor material comprises silicon.

31. A piezoelectric structure according to claim 21 wherein said substrate comprises a material different from said filler material.

32. A piezoelectric structure according to claim 21 wherein said first semiconductor material is chosen from the group consisting of silicon carbide, carbon nitride, gallium nitride, aluminum nitride, boron nitride, and alloys of group III–V nitrides.

33. A piezoelectric structure according to claim 21 wherein said piezoelectric layer extends across said smooth planar surface covering at least two of said semiconductor islands and portions of said filler material therebetween.

34. A piezoelectric structure according to claim 21 wherein said microelectronic circuit is chosen from the group consisting of a transistor, a capacitor, a diode, and a resistor.

* * * * *